(12) United States Patent
Zhang et al.

(10) Patent No.: US 7,642,021 B2
(45) Date of Patent: Jan. 5, 2010

(54) METHOD OF MAPPING LITHOGRAPHY FOCUS ERRORS

(75) Inventors: Guohong Zhang, Plano, TX (US);
Stephen J. DeMoor, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 322 days.

(21) Appl. No.: 11/626,009

(22) Filed: Jan. 23, 2007

(65) Prior Publication Data

US 2008/0176045 A1 Jul. 24, 2008

(51) Int. Cl.
*G03F 9/00* (2006.01)
*G03C 5/00* (2006.01)

(52) U.S. Cl. .......................... 430/30; 430/313
(58) Field of Classification Search ................ 430/5, 430/30, 313
See application file for complete search history.

(56) References Cited

U.S. PATENT DOCUMENTS 6,811,939 B2 * 11/2004 Nakao et al. ................ 430/30

OTHER PUBLICATIONS

Brunner et al., "Quantative Stepper Metrology using the Focus Monitor Test Mask", Proceeding of SPIE, vol. 2197, 541 (1994).
Zhang et al., "Across Wafer Focus Mapping and its Applications in Advanced Technology Nodes", Proceeding of SPIE, vol. 6154, 61540N (2006).

* cited by examiner

*Primary Examiner*—Christopher G Young
(74) *Attorney, Agent, or Firm*—Warren L. Franz; Wade J. Brady, III; Frederick J. Telecky, Jr.

(57) ABSTRACT

The present application is directed to a method for determining photolithography focus errors during production of a device. The method comprises providing a substrate and forming a photoresist pattern on the substrate. The photoresist pattern comprises a device pattern and one or more blocking scheme patterns. The process further comprises performing a device manufacturing process using the photoresist pattern as a mask to form sensor windows on the substrate. One or more focus error sensors are formed in the sensor windows. Focus errors are determined using the focus error sensors. Other embodiments of the present application are directed to wafers comprising one or more focus error sensors positioned in sensor windows.

12 Claims, 5 Drawing Sheets

METHOD OF MAPPING LITHOGRAPHY FOCUS ERRORS

DESCRIPTION OF THE DISCLOSURE

1 Field of the Disclosure

The present application relates generally to the field of photolithography, and more specifically to a method for mapping photolithography focus errors.

2 Background of the Disclosure

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc.) has been built up around this technology.

In this process, a mask, or "reticle", includes a device pattern formed of an opaque material, such as chrome, on a transparent or semitransparent substrate. The transmission of the opaque material may also vary, such as in the case of an attenuating phase shift mask. The device pattern of the reticle can be transferred to a photoresist film using imaging techniques well known in the art. For example, a stepper that includes a light source and optics that project light coming through the reticle can be used to image the device pattern, often with, for example, a 4× to 5× reduction factor, onto a photoresist film. The photoresist can then be developed and used as a mask pattern for processing the device, as is well known in the art.

In photolithography, failing to achieve acceptable focus of the pattern during the imaging process can result in pattern defects, which can translate into device defects and possibly device failure. Further, as the critical dimensions of integrated circuits continue to decrease, the parameters for achieving acceptable focus of the imaging pattern have become more stringent. For example, the Rayleigh depth of focus has continued to decrease, while at the same time, stepper lense fields have grown, compounding the problem of keeping all parts of the field in acceptable focus.

In order to improve focus control and reduce focus errors, methods for quantitatively measuring focus variations and/or focus errors within a process have been developed. Considerable research has been done on methods of focus metrology. One type of metrology technique which has been developed employs phase-shift focus monitor (PSFM) patterns. Such PSFM techniques employ phase shift technology to translate focus errors into easily measurable overlay shifts in the PSFM patterns. One such technique was developed by IBM, and is disclosed in the paper entitled, "Quantitative stepper metrology using the focus monitor test mask," authored by T. A. Brunner, et al., Proceeding of SPIE, Vol. 2197, 541 (1994), the disclosure of which is hereby incorporated by reference in its entirety.

However, there have been difficulties in incorporating known metrology techniques into production flow due to, for example, interference from existing circuit patterns and topography. Thus, there is a need for improved metrology methods that allow sensing of focus errors during actual production flow.

SUMMARY OF THE DISCLOSURE

In accordance with the disclosure, an embodiment of the present application is directed to a method for determining photolithography focus errors during production of a device. The method comprises providing a substrate and forming a photoresist pattern on the substrate. The photoresist pattern comprises a device pattern and one or more blocking scheme patterns. The process further comprises performing a device manufacturing process using the photoresist pattern as a mask to form sensor windows on the substrate. One or more focus error sensors are formed in the sensor windows. Focus errors are determined using the focus error sensors.

Another embodiment of the present application is directed to a wafer. The wafer comprises a substrate and a device pattern formed on the substrate. The device pattern has one or more sensor windows. One or more focus error sensors are positioned in the sensor windows.

Additional embodiments and advantages of the disclosure will be set forth in part in the description which follows, and can be learned by practice of the disclosure. It is to be understood that both the foregoing general description and the following detailed description are exemplary and explanatory only and are not restrictive of the disclosure, as claimed.

The accompanying drawings, which are incorporated in and constitute a part of this specification, illustrate several embodiments of the disclosure and, together with the description, serve to explain the principles of the disclosure.

DESCRIPTION OF THE EMBODIMENTS

Reference will now be made in detail to various exemplary embodiments of the present application, examples of which are illustrated in the accompanying drawings. Wherever possible, the same reference numbers will be used throughout the drawings to refer to the same or like parts.

Figure 1:
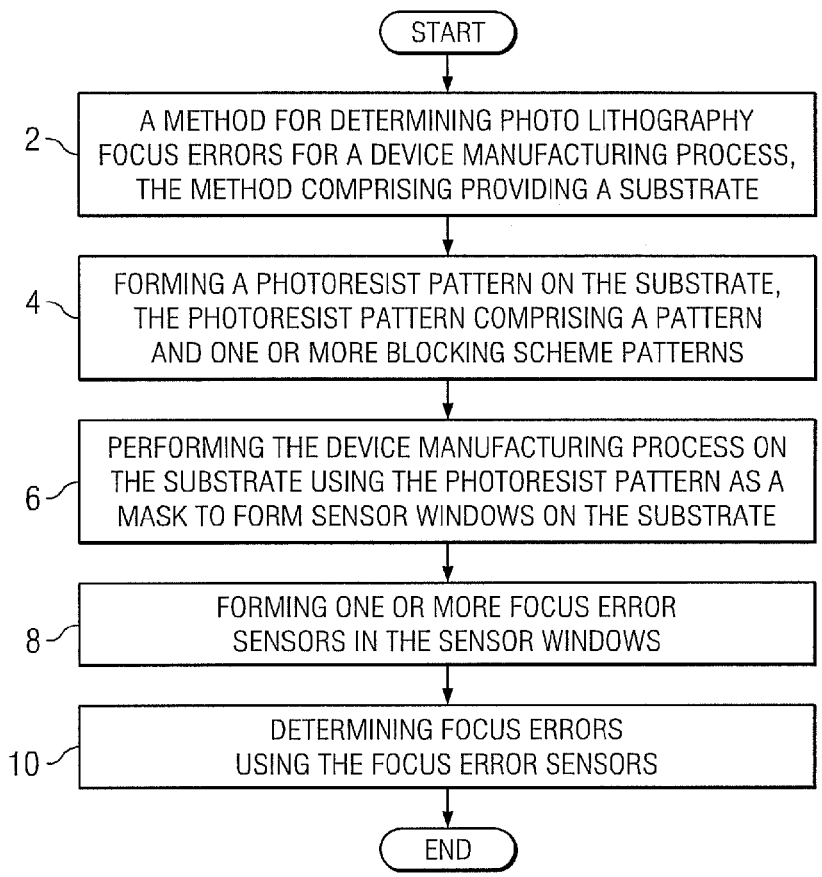
FIG. 1 is a flow chart illustrating a method for determining photolithography focus errors during the production of a device, according to an embodiment of the present application.

FIG. 1 illustrates a method for determining photolithography focus errors during the production of a device, according to an embodiment of the present application. The method may be employed for manufacturing any device for which focus sensitive photolithography can be employed in the manufacturing process, such as integrated circuit devices, MEMS devices, and panel display fabrication.

As shown in block 2 of FIG. 1, the process can begin by providing a substrate. In one embodiment, the substrate may include one or more partially completed integrated circuit devices. The substrate may include any materials suitable for forming the device being manufactured. Examples of suitable materials include semiconductors, such as silicon, germanium and gallium arsenide; insulators, such as silicon dioxide, silicon nitride and polyimide; and metals, such as aluminum, copper, titanium, and tungsten.

As shown in block 4, after the substrate is provided, a photoresist pattern is formed on the substrate. The photoresist pattern can include a device pattern and one or more blocking scheme patterns where a portion of the device pattern has been replaced by the one or more blocking scheme patterns.

The device pattern included in the photoresist pattern can be any desired pattern that is employed during actual production to form the device being fabricated. Suitable device patterns are well known for use in fabricating devices, such as integrated circuits and MEMS devices. Examples of such patterns include, but are not limited to, active region patterns, gate patterns, contact patterns and interconnect patterns. Such device patterns may be employed in, for example, selective etching, selective deposition, and selective ion implanting processes.

The one or more blocking scheme patterns included in the photoresist pattern replace portions of the device pattern. This results in regions of reduced topography, termed herein as sensor window regions, in the substrate being processed. The focus error sensors can subsequently be formed in these sensor window regions. The clearance of circuit patterns in the sensor window regions makes it possible to measure focus errors using the focus sensors and appropriate metrology techniques, as will be discussed in greater detail below.

The photoresist pattern, including both the device pattern and blocking scheme pattern, can be formed by any suitable photolithography process. Suitable photolithography techniques are well known in the art. In one embodiment, multiple exposures can be employed to pattern the photoresist.

For example, the photoresist pattern can be formed by first imaging the device pattern, and then imaging the blocking scheme pattern, on the photoresist, as will be discussed in greater detail below. The blocking scheme portions of the photoresist, where the sensor window regions are to be formed, are then removed when the photoresist is developed, thereby replacing portions of the device pattern that would otherwise be formed in the photoresist.

After forming the photoresist pattern of block 4, the process of block 6 of the FIG. 1 embodiment comprises performing a device manufacturing process on the substrate using the photoresist pattern as a mask. The device manufacturing process may include any process that can be employed during actual production flow to form the device being fabricated.

Suitable manufacturing processes are well known in the art. Such manufacturing processes may include, for example, material removal processes, such as dry or wet etching, chemical mechanical planarization (CMP), and laser ablation; deposition or growth processes, such as a chemical vapor deposition processes (CVD), oxidation and nitridation; ion implanting processes; and/or cleaning processes, as well as any other suitable process.

In some embodiments, the device manufacturing process carried out in this embodiment can include multiple processes. For example, the device manufacturing process may include a selective etch, deposition of a layer, and planarization of the layer, such as by CMP, all as part of the same device manufacturing process. In some embodiments, the device manufacturing process may include removal of the photoresist.

In some embodiments, the device manufacturing process can include all of the processes carried out between two consecutive imaging levels in the production flow process. For example, where the photoresist pattern of block 4 is a device pattern for forming active regions of a transistor, the device manufacturing process may include all the processes that are used in actual production flow between patterning of the active region and the next patterning step of the production flow process, which in this example may be a gate patterning step. In another embodiment, the photoresist pattern of block 4 is a gate pattern with sensor window regions formed therein, and the device manufacturing process of block 6 can include all of the processes that are used in actual production flow between forming the gate pattern and the next patterning step of the production process, which may be, for example, forming a contact pattern. In yet another example, the photoresist pattern of block 4 is an interconnect pattern used for patterning an interlevel dielectric layer in a multi-level, damascene interconnect structure, and the device manufacturing process of block 6 can include all of the processes that are used in actual production flow between forming the interconnect pattern and the next patterning step of the production process, which may be, for example, patterning a second interconnect. Suitable methods for carrying out these processes are well known in the art.

After performing the device manufacturing process of block 6, the process of the FIG. 1 embodiment includes forming focus error sensors in the areas of the substrate over which the sensor window regions were formed, as shown in block 8. Any suitable focus error sensors may be formed. Examples of suitable focus error sensors that are well known in the art include phase-shift focus monitors (PSFM), line-end pull back and telecentricity shift. The focus sensors may be formed of any suitable material using any suitable techniques, including materials and techniques that are well known in the art.

After forming the focus sensors, the process of the FIG. 1 embodiment includes determining focus errors using the focus error sensors, as shown in block 10. The process of determining focus errors may be carried out using any suitable technique. One such method includes measuring the translational shift of the focus error sensors using an overlay metrology tool, which captures detailed focus error and process finger prints with high precision and high sampling rate. Focus errors are then determined from the translational overlay shifts using standard calibration techniques known in the art. One example of a well known process for determining focus errors in this manner is described in the paper entitled, "Quantitative stepper metrology using the focus monitor test mask," authored by T. A. Brunner, et al., Proceeding of SPIE, Vol. 2197, 541 (1994), the disclosure of which is hereby incorporated by reference in its entirety.

In some embodiments, determining focus error from overlay shift may be done through in-situ calibration of the overlay metrology tool at each pattern level. Calibration can also be performed at different lens locations of the exposure field at the same level. Calibration curves can be different for each pattern level. Performing in situ calibration at each pattern level can account for the PSFM response variation to different processes and substrates. The in situ calibration curve can be fitted to any suitable mathematical expression for determining overlay shift as a function of focus, such as the following formula I, for example in a Taylor expansion, using calibration methods well known in the art:

$$O = a(f-f_0)^3 + b(f-f_0) \qquad \text{I}$$

where

O is overlay shift;

a is a third order coefficient dependant on film stack, projection optics and the photolithography process;

b is a linear coefficient dependant on film stack, projection optics and the photolithography process;

$f_0$ is the best focus; and $f-f_0$ is the Focus shift.

FIGS. 2A to 2D illustrate a method for sensing photolithography focus errors in a manufacturing process for making an integrated circuit device, according to an embodiment of the present application. The illustrated embodiment is directed to a front end of the line process comprising a first imaging process for manufacturing shallow trench isolation ("STI") structures, followed by a second imaging process, such as for patterning a gate of a transistor. However, the principles of the present application can be applied to any imaging step in the fabrication process.

Figure 2A:
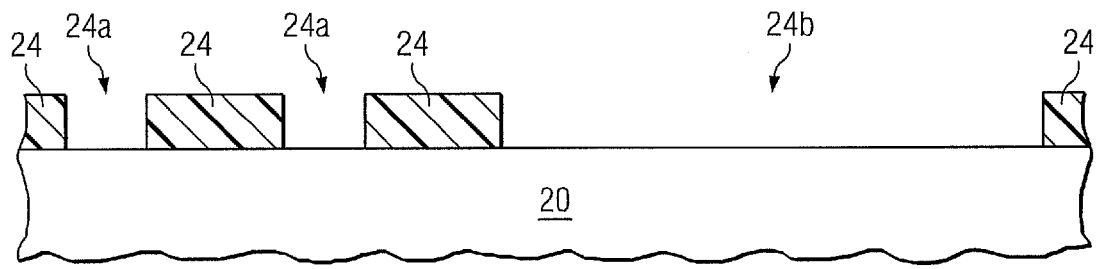
FIGS. 2A to 2D illustrate a method for sensing photolithography focus errors in a manufacturing process for making an integrated circuit device, according to an embodiment of the present application.

FIG. 2A illustrates a substrate 20, with a photoresist pattern 24 formed thereon. In this embodiment, substrate 20 may comprise a semiconductor material, such as, for example, silicon, gallium arsenide, or germanium. In other embodiments, other types of suitable substrate materials can also be employed. Non-limiting examples of other suitable substrate materials include dielectric materials, such as glass.

Photoresist pattern 24 includes device patterns 24a for forming STI structures, as well as an additional "blocking scheme" pattern 24b. The purpose of the blocking scheme pattern 24b is to block out portions of the STI pattern 24a, which would otherwise be patterned in the STI patterning process during actual production, thereby forming window regions in which sensors may subsequently be positioned, as will be described below.

In one embodiment, the process for patterning photoresist 24 includes multiple exposures of photoresist 24. For example, a first product reticle (not shown) can be employed through which STI patterns 24a are imaged in photoresist 24. This reticle can be the same reticle that is employed in the STI imaging process as it would be carried out in a typical production run. Prior to developing photoresist layer 24, a second imaging process can be carried out in which photoresist layer 24 is exposed to radiation through a "blocking scheme" reticle (not shown). This second exposure effectively blocks out portions of the STI pattern associated with blocking scheme regions 24b by exposing these regions of the undeveloped photoresist to radiation and making them soluble in the developer. The photoresist in blocking scheme regions 24b can then be removed during development of the resist. In an alternative embodiment, a single exposure process can be employed in which a reticle incorporating both the STI patterns and blocking scheme pattern is used to image photoresist layer 24.

Figure 3:
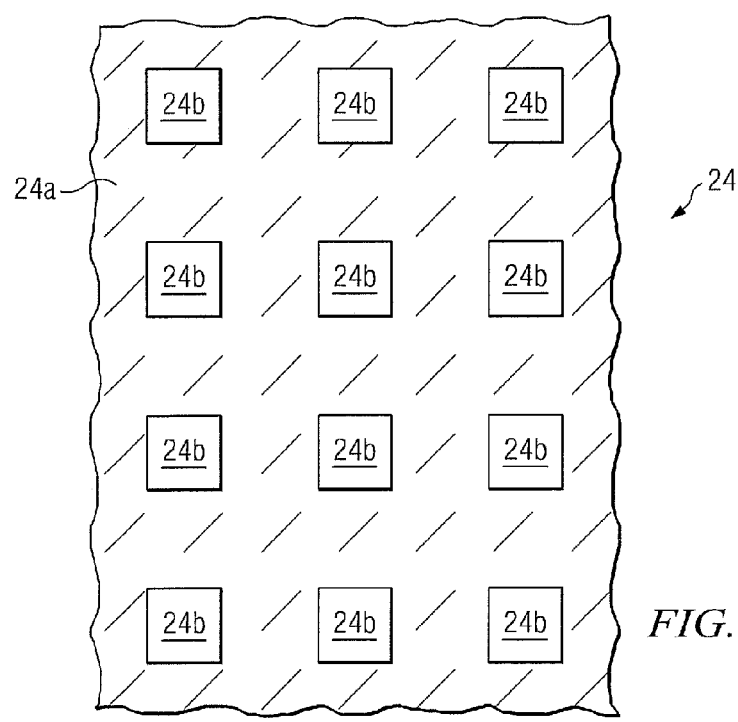
FIG. 3 illustrates one example of patterned photoresist in which a blocking scheme pattern is arranged in an array of windows positioned in rows and columns, according to an embodiment of the present application.

The blocking scheme pattern may be any desired pattern that will provide the desired sensor window regions in which sensors can be formed, as will be discussed in greater detail below. FIG. 3 illustrates one example of patterned photoresist 24 in which blocking scheme pattern 24b is arranged in an array of windows positioned in rows and columns. As shown in FIG. 3, blocking scheme 24b replaces portions of device pattern 24a, represented by the hatched region.

The blocking scheme pattern 24b can have any desired dimensions that will provide sufficient area for forming the focus sensors. However, more accurate focus error data may be achieved using smaller blocking scheme patterns that do not significantly interfere with the fabrication process as it would generally be carried out in an actual production run. The appropriate dimensions of blocking scheme pattern 24b may thus depend on the size of the device pattern. For example, where critical dimensions of the device pattern are 0.1 micron or smaller, the windows of pattern 24b can have an area of about 200 square microns or more, such as about 400 square microns to about 800 square microns. In other embodiments, windows of pattern 24b may have areas less than 200 square microns. While the illustrated embodiment of FIG. 3 shows blocking scheme pattern 24b in the shape of squares, other polygons, such as triangles, pentagons, and hexagons, as well as circles, ovals, or any other desired shape may be used.

Figure 2B:
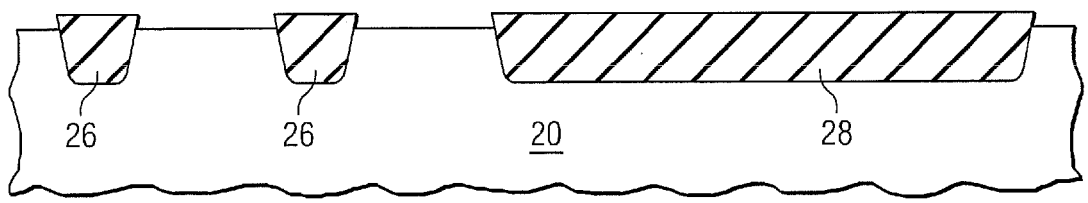

After photoresist layer 24 is developed to form patterns 24a and 24b, the STI structures are formed as would otherwise occur in the STI forming process. Referring to FIG. 2B, STI structures 26 can be formed by any suitable method. Suitable methods are well known and can include etching to form shallow trenches in substrate 20 using photoresist layer 24; removing photoresist layer 24; depositing a dielectric in the shallow trenches; and an etch back or chemical mechanical planarization process to planarize the dielectric in the shallow trench. This process for forming STI structures 26 also forms a blocking region 28, corresponding to the blocking scheme pattern 24b, that comprises a relatively large trench structure filled with the same dielectric as the STI structures 26.

Figure 2C:
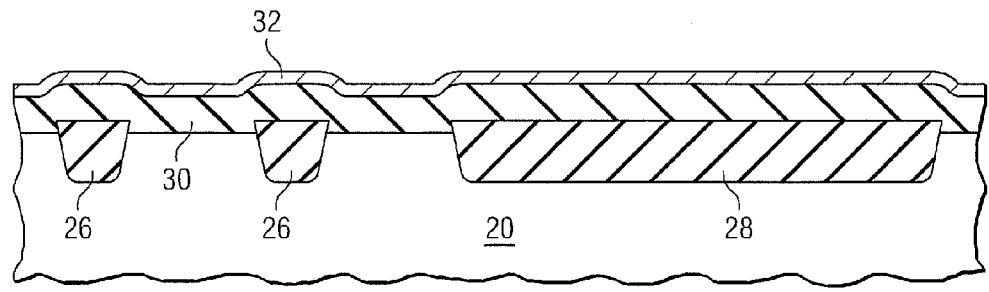

Following formation of STI structures 26 and blocking region 28, additional processing is carried out as would typically occur in the device fabrication process. For example, as shown in FIG. 2C, layers used for forming a gate, such as a polysilicon layer 30 can be formed, followed by anti-reflective layer 32. In one non-limiting example, anti-reflective layer 32 can be an inorganic anti-reflective coating (IARC), although organic anti-reflective coatings may also be employed. Techniques for forming such polysilicon layers and anti-reflective coatings are well known in the art.

Figure 2D:
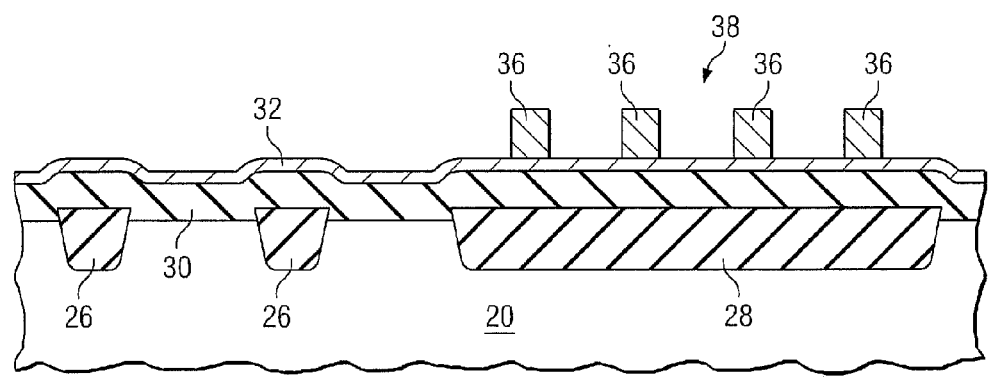

After all the processing is carried out that would normally be carried out up to the point where the next imaging step would take place in the fabrication process, focus sensors 36 are formed, as illustrated in FIG. 2D. As seen from FIG. 2D, focus sensors 36 are formed in a "sensor window" 38 that corresponds to the surface region over the blocking region 28. Blocking region 28 effectively reduces topography in the sensor window 38 that might otherwise be caused by underlying patterned structures, such as the STI structures, and provides a place for the focus sensors 36 to be positioned.

Figure 4:
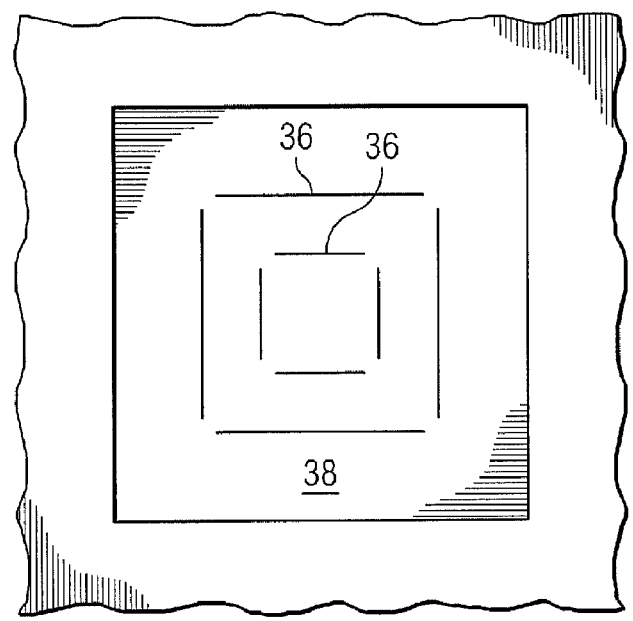
FIG. 4 illustrates an example of a PSFM focus sensor, according to an embodiment of the present application.

As discussed above, focus sensor 36 can be any suitable focus sensor, such as a PSFM. One example of a suitable PSFM focus sensor 36 is shown in FIG. 4. The focus sensor 36 of the FIG. 4 embodiment is known as a "box-in-box" PSFM.

Focus sensor 36 can comprise any suitable material and be formed using any suitable techniques. In one embodiment, focus sensor 36 can be a photoresist pattern. For example, focus sensor 36 can be formed by depositing a photoresist on the substrate and patterning the photoresist using photolithography techniques which are well known in the art.

After focus sensor 36 has been formed in sensor window regions 38, focus errors can be determined using any suitable metrology techniques, such as the metrology techniques described above. In embodiments where focus sensors 36 are positioned over the entire substrate surface, the number of sensors per unit area employed on the substrate surface can vary to provide the desired amount of focus error data. Focus error variations can then be mapped out for the entire substrate by determining the focus errors at individual focus sensor sites across the substrate surface.

Figure 5A:
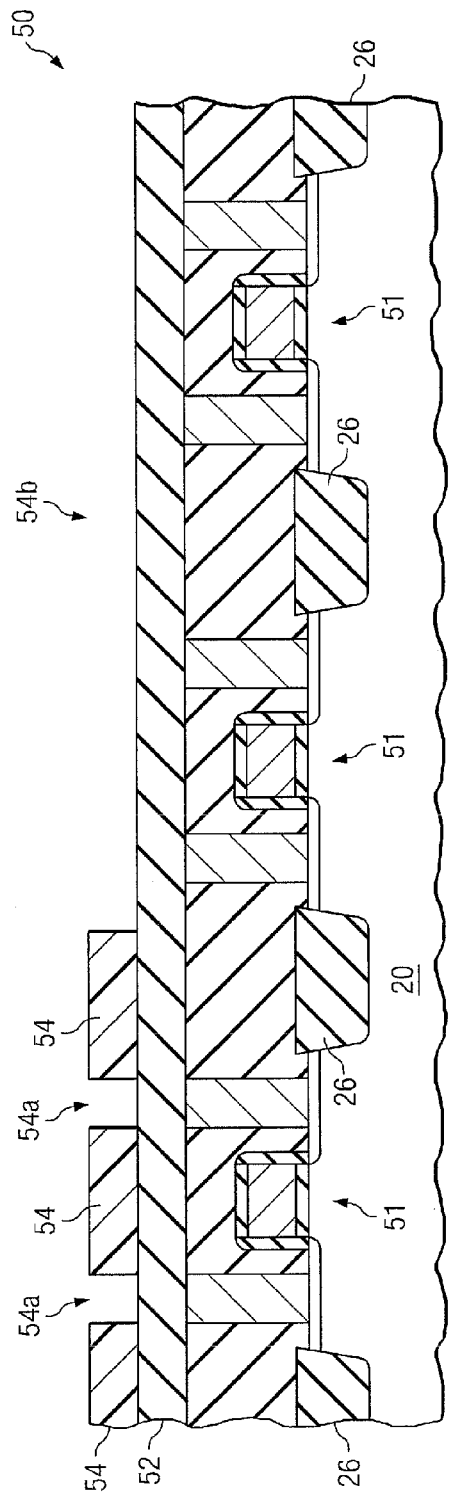
FIGS. 5A to 5C illustrate a method for sensing focus errors in a process for forming multi-level interconnects, according to an embodiment of the present application.
Figure 5B:
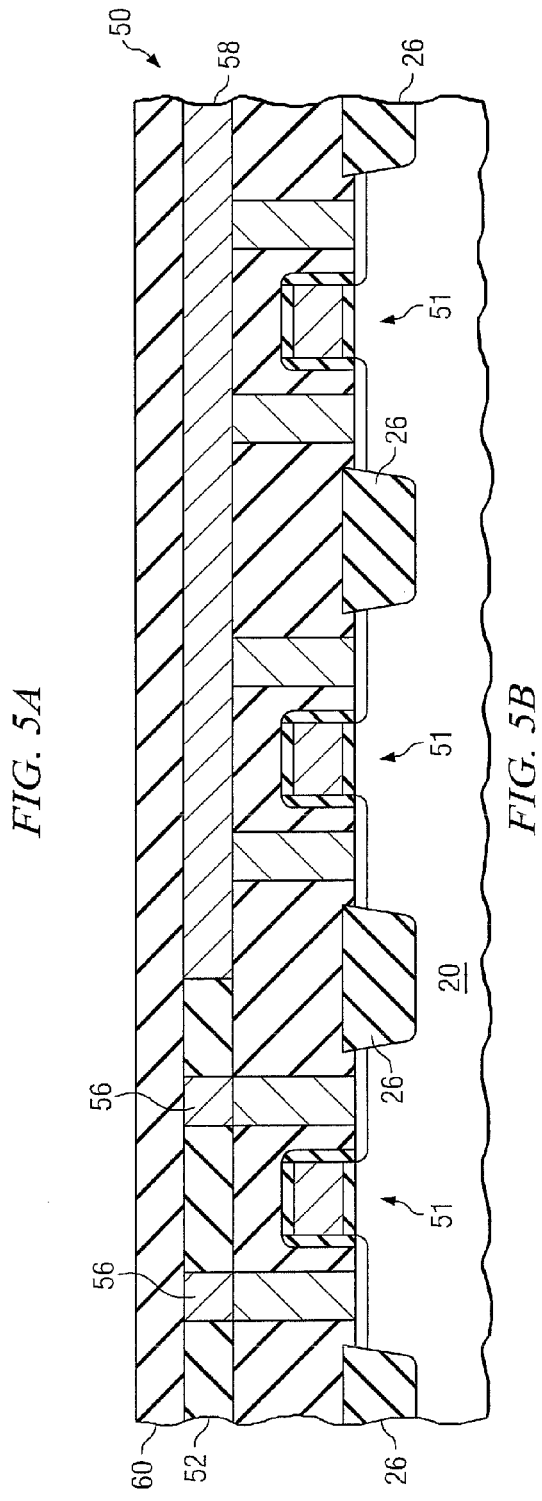
Figure 5C:
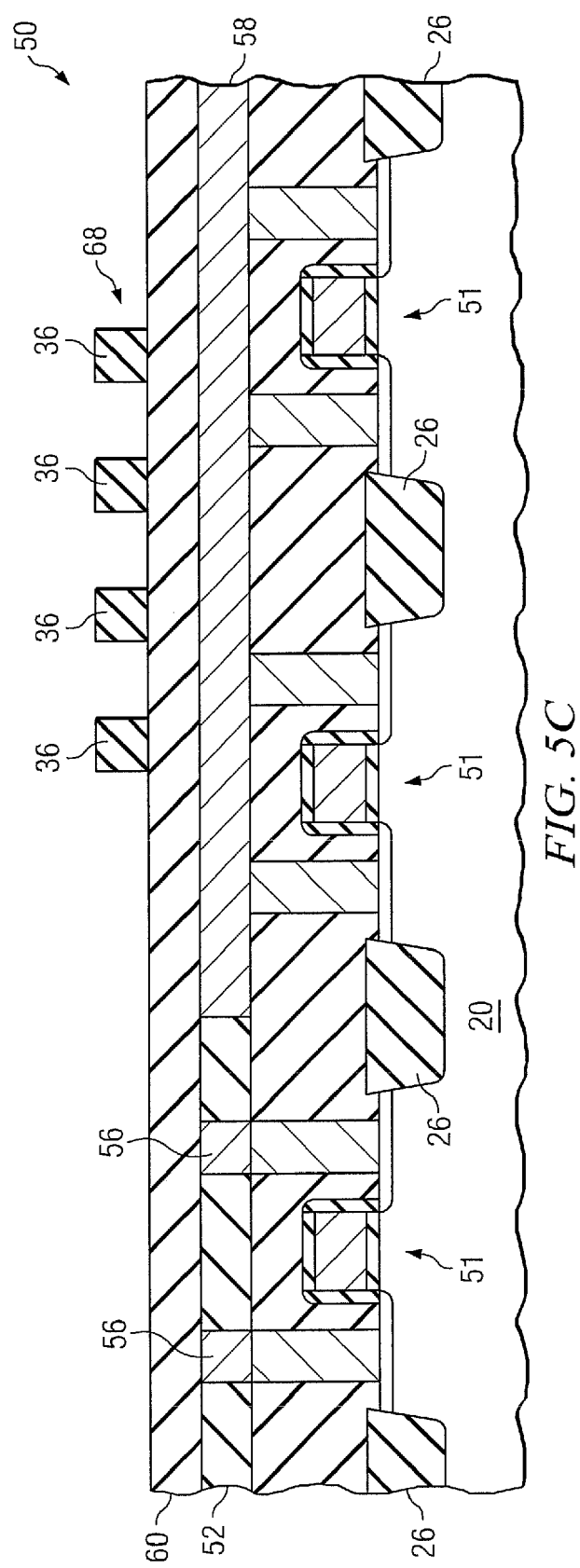

The concepts of the present application can be applied at any point in the device fabrication process flow. For example, FIGS. 5A to 5C illustrate the methods of the present application as applied to a back end-of-line process for forming multi-level interconnects. FIG. 5A shows a partially processed wafer 50 having a number of devices 51 formed thereon, which in this non-limiting example include MOS- FETs. A multi-level metallization structure is employed, which can comprise multiple intermetal dielectrics formed between vertically stacked metallization levels, as is well known in the art.

The illustrated embodiment employs a blocking scheme pattern 54b that blocks out portions of an interconnect pattern 54a of an intermetal dielectric photoresist pattern 54, as shown in FIG. 5A. The process for patterning photoresist 54 can be a multiple exposure process that utilizes a first product reticle and a "blocking scheme" reticle (not shown), similarly as described above in the embodiment of FIG. 2A, except that the product reticle employed in this case would be for patterning intermetal dielectric 52. In an alternative embodiment, a single exposure process can be employed in which a reticle incorporating both the intermetal dielectric patterns and blocking scheme pattern is used to image photoresist layer 54.

The blocking scheme pattern 54b may be any desired pattern that will provide the desired sensor window regions in which sensors can be formed, similarly as described above for blocking scheme pattern 24b. The blocking scheme pattern 54b can have any desired shape and/or dimensions that will provide sensor window regions with sufficient area for forming the focus sensors, such as any of the shapes or dimensions described above for forming windows of blocking scheme pattern 24b.

After photoresist layer 54 is developed, a sequence of process steps normally carried in the fabrication process to form interconnects is performed. Referring to FIG. 5B, this can comprise processes for forming metal wires 56, which can include, for example, etching intermetal dielectric 52 to form trenches, filling the trenches with metal, a CMP process to planarize the structure and remove any excess metal, as well as various other steps, such as forming polish stop layers, adhesion layers, capping layers, and cleaning processes, all of which are well known in the art. The trench forming process results also results in a blocking region 58, corresponding to blocking scheme pattern 54b, that comprises a relatively large trench structure filled with the same metallization material as metal wires 56.

Following formation of metal wire structures 56 and blocking region 58, additional processing is carried out, as would typically occur in the interconnect fabrication process being characterized, up to the point in the process in which further imaging is performed. This can include forming a second intermetal dielectric 60, which can be a single or multi-layered structure, as is well known in the art. It can also include other processing, such as forming anti-reflective layers, adhesion layers, cleaning processes, and any other processes employed in the actual production flow process. At the point in the fabrication process where a subsequent imaging step would generally occur, focus sensors 36 are formed, as illustrated in FIG. 5C. Similarly as described above in the embodiment of FIG. 2D, focus sensors 36 are formed in a "sensor window" 68 that corresponds to the surface of the layers formed over the blocking region 58. Blocking region 58 effectively reduces topography in the sensor window 68 that might otherwise result due to the patterning of vias, metal lines, and underlying device structures, and provides a place for the focus sensors 36 to be positioned and measured.

Focus sensor 36 in this embodiment can be any of the focus sensors formed by any of the techniques described herein. For example, focus sensor 36 can be formed by depositing a photoresist on the substrate and patterning the photoresist using photolithography techniques which are well known in the art.

After formation of focus sensors 36, suitable metrology techniques, such as those described above, can be employed to characterize focus error. Focus error variations can then be mapped out for the entire substrate by determining the focus errors at individual focus sensor sites across the substrate.

As is well known in the art, shot maps are used for determining the position of imaging fields on the substrate in processes that employ stepper or step-and-scan techniques. The techniques of the present application can be adapted for use with any shot map for making any device. If desired, the same shot maps and resist processes can be used for forming and patterning the focus sensors at different pattern levels in order to maintain the same or similar focus and leveling throughout the process. For scanning or step-and-scan processes the same or similar scan sequence used in the production runs can also be employed.

In the embodiments described above, portions of the device pattern are replaced by the blocking scheme patterns, as indicated in block 4 of the embodiment of FIG. 1, and as is shown in the embodiments of FIGS. 2 and 5. In some instances, this can render the devices inoperable, and may result in the entire test wafer being scrapped.

Other embodiments are contemplated where blocking scheme patterns do not replace portions of the device pattern that would render devices inoperable. For example, blocking scheme patterns could be positioned so as not to interfere with the device patterns in a way that would render the devices inoperable. In this embodiment, the device manufacturing process may be carried out and the focus error sensors formed in the areas of the substrate over which the sensor window regions are formed, similarly as described above, thus allowing determination of the focus errors. However, rather than scrapping the wafer, the above process can be integrated into the production flow in a manner that allows for the completion of operable devices, which could be sold as usable products. One of ordinary skill in the art would readily be able to integrate the processes of the present application into device production in this manner.

Focus error data determined using the techniques of the present application can be used to improve focus control in the fabrication process. For example, the focus error data can be used to determine the sources of focus error with the aim of reducing or eliminating these sources of error. The total focus error realized during imaging at any point on the wafer can potentially arise from a variety of sources, or components. These focus error components can vary depending on the type of imaging system employed, such as steppers, scanners, non-reduction step-and-repeat projection aligners, and step-and scan systems. In the case of step-and scan systems, focus error components may include imperfections in the projection lense, scanner calibration, as well as intrafield components and interfield components. Intrafield focus error can arise from, for example, topography variations within each field and the adjustments made by the scanner to account for these variations. Interfield focus error can arise from variations that occur from field to field, such as scanner recalibration, which can occur between each independent scan in a step-and-scan sequence.

By employing the focus error sensing techniques of the present application, focus errors can be mapped out through the entire production flow. For example, focus sensors can be positioned at each pattern level of the fabrication process. In this manner, across the wafer focus errors can be determined at, for example, the active pattern level, gate pattern level, contact pattern level, and any of the metal pattern levels of, for example, a multi-level interconnect structure. Using the resulting data, maps of the focus errors at each pattern level can be generated.

By sensing and mapping focus error using the processes of the present application, across wafer focus variations and across chip focus variations can be determined. This data can then be used to determine how such focus variations affect patterning processes and device yield.

Figure 6:
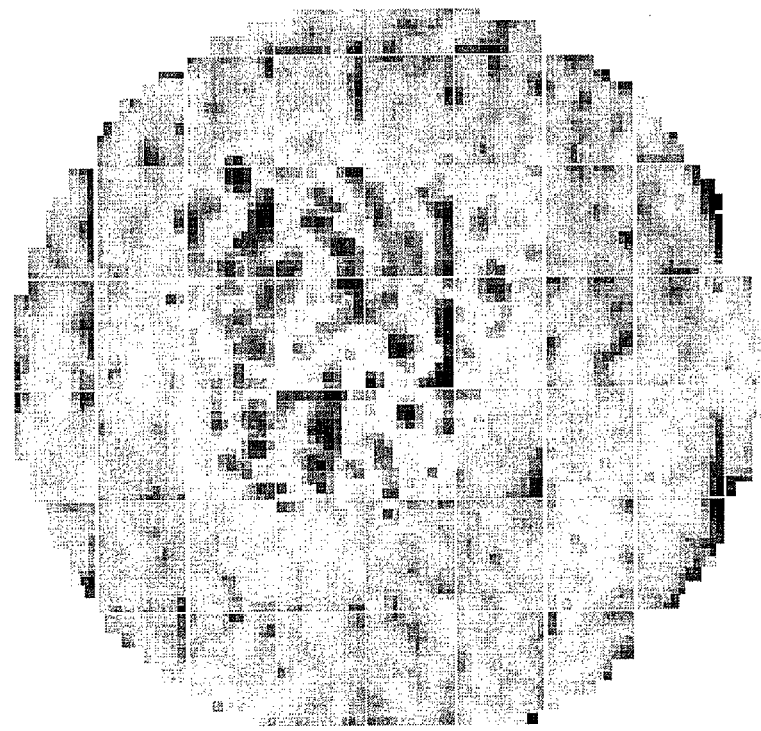
FIG. 6 is one example of a focus error map of a contact pattern level, generated according to principles of the present application.

For example, FIG. 6 is a map of focus errors at a contact pattern level generated according to principles of the present application, where darker regions represent areas of greater focus error. As seen from this map, several fields near the center of the wafer are darker, indicating increased focus error in these fields. Similar maps (not shown) of a number of other wafers at the contact stage were also generated. The focus error data generated was found to correlate with variations in the poly-metal dielectric (PMD) layer thickness for a given wafer, as well as in PMD thickness variations from wafer to wafer. These thickness variations were in turn caused by lack of control in the chemical mechanical planarization process. In this manner, a particular source of focus error, namely lack of CMP control, was identified.

The effects of forming devices near a wafers edge can also be analyzed using focus error techniques of the present application. It is well known in the art that die close to the wafer edge tend to be less robust in yield. This is in part due to lack of focus control during the imaging process caused by changing boundary conditions at or near the wafer edge, as well as a reduced ability of steppers to sense variations in wafer flatness near the edge of the wafer. By determining across wafer focus variations of different wafers using the processes of the present application, and then comparing that data to device defect map data obtained for devices made on those wafers, correlations can be made as to how across wafer focus variations affect defects in devices formed near the wafer edges. This information may then be used to determine whether process improvements that reduce focus error should be made to increase device yield at the wafer edge.

Thus, focus error data generated using the processes of the present application can be employed to identify sources of focus error throughout the fabrication process. The data can also be used to determine depth of focus budgets for imaging various device patterns. Further description of how the above mentioned applications, including the focus error effects of chemical mechanical polishing, wafer edge effects, depth of focus budgeting, as well as other applications of the focus error sensing and mapping techniques of the present application, can be found in a paper entitled "Across Wafer Focus Mapping and Its Applications in Advanced Technology Nodes," by G. Zhang et al, Proceeding of SPIE, Vol. 6154, 61540N (2006). The disclosure of the Zhang et al. paper is hereby incorporated by reference in its entirety.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method for determining photolithography focus errors during production of a device, the method comprising:
    providing a substrate;
    forming a photoresist pattern on the substrate, the photoresist pattern comprising a device pattern and one or more blocking scheme patterns;
    performing a device manufacturing process using the photoresist pattern as a mask to form sensor windows on the substrate;
    forming one or more focus error sensors in the sensor windows; and
    determining focus errors using the focus error sensors.

2. The method of claim 1, wherein the device manufacturing process is a process for manufacturing an integrated circuit.

3. The method of claim 1, wherein the device manufacturing process comprises at least one process chosen from chemical etching, chemical mechanical planarization, ion implanting, deposition of a layer or growth of a layer.

4. The method of claim 1, wherein the blocking scheme pattern replaces a portion of the device pattern.

5. The method of claim 1, wherein the device manufacturing process comprises removing the photoresist pattern from the substrate.

6. The method of claim 1, wherein forming the photoresist pattern comprises:
    depositing a photoresist on the substrate;
    exposing the photoresist to radiation through a product reticle having a device pattern;
    exposing the photoresist to radiation through a second reticle having a blocking scheme pattern; and
    developing the photoresist.

7. The method of claim 6, wherein the blocking scheme pattern comprises a plurality of windows for blocking out device patterns, the windows being positioned in an array.

8. The method of claim 1, wherein forming the focus error sensors comprise:
    depositing a second photoresist on the substrate; and
    patterning the second photoresist to form the focus error sensors.

9. The method of claim 8, wherein the focus error sensors are phase-shift focus monitor patterns, and determining the focus errors comprises measuring overlay shifts of the phase-shift focus monitor pattern.

10. A method for determining photolithography focus errors during production of a device, the method comprising:
    providing a substrate;
    forming a first patterned photoresist over the substrate;
    etching the substrate using the first patterned substrate as a mask to form at least one blocking scheme pattern opening and a device structure pattern opening;

forming a blocking region layer in the blocking scheme pattern opening to provide a sensor window;

forming a device structure layer in the device pattern opening;

forming a focus sensor layer over the blocking region layer in the sensor window; and patterning the focus sensor layer over the blocking region layer with a second layer of photoresist to form at least one focus sensor over the blocking region layer in the sensor window, wherein the formation of the blocking region layer reduces topography in the sensor window.

11. The method of claim 10, wherein a portion of the device pattern is replaced by the at least one blocking scheme pattern.

12. The method of claim 10 wherein the formation of the blocking region layer and the formation of the device structure layer comprises forming at least one common layer.

* * * * *